United States Patent
Tezuka

(10) Patent No.: US 11,315,616 B2
(45) Date of Patent: Apr. 26, 2022

(54) CONTROL CIRCUIT, SEMICONDUCTOR MEMORY DEVICE, INFORMATION PROCESSING DEVICE, AND CONTROL METHOD

(71) Applicant: Sony Semiconductor Solutions Corporation, Kanagawa (JP)

(72) Inventor: Hiroyuki Tezuka, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 94 days.

(21) Appl. No.: 16/491,928

(22) PCT Filed: Feb. 14, 2018

(86) PCT No.: PCT/JP2018/005037
§ 371 (c)(1),
(2) Date: Sep. 6, 2019

(87) PCT Pub. No.: WO2018/163730
PCT Pub. Date: Sep. 13, 2018

(65) Prior Publication Data
US 2021/0134337 A1   May 6, 2021

(30) Foreign Application Priority Data
Mar. 9, 2017   (JP) .............................. JP2017-045015

(51) Int. Cl.
*G11C 11/16* (2006.01)
(52) U.S. Cl.
CPC ...... *G11C 11/1659* (2013.01); *G11C 11/1673* (2013.01); *G11C 11/1675* (2013.01)

(58) Field of Classification Search
CPC ............ G11C 11/1659; G11C 11/1673; G11C 11/1675
(Continued)

(56) References Cited

U.S. PATENT DOCUMENTS

| | | | |
|---|---|---|---|
| 8,144,509 B2* | 3/2012 | Jung | ........................ G11C 8/12 365/171 |
| 9,607,675 B1* | 3/2017 | Huang | ................ G11C 11/1675 |

(Continued)

FOREIGN PATENT DOCUMENTS

| | | |
|---|---|---|
| JP | 2013-251035 A | 12/2013 |
| JP | 2014-191835 A | 10/2014 |

(Continued)

OTHER PUBLICATIONS

International Search Report and Written Opinion issued in connection with International Patent Application No. PCT/JP2018/005037 dated Mar. 27, 2018. (7 pages).

*Primary Examiner* — Sung Il Cho
(74) *Attorney, Agent, or Firm* — K&L Gates LLP

(57) ABSTRACT

To provide a control circuit capable of not only suppressing an increase in power consumption with a simple configuration but also preventing erroneous writing and destruction of a memory element.
Provided is a control circuit that outputs a signal for discharging charges accumulated in a source line and a bit line according to activation of a word line, and outputs a signal for making the source line and the bit line be in a floating state by a start of writing or reading, with respect to a memory cell including the source line, the bit line, a transistor that is provided between the source line and the bit line, and switches on and off by a potential of the word line, and a memory element connected to the transistor in series.

10 Claims, 11 Drawing Sheets

(58) Field of Classification Search
USPC .......................................................... 365/158
See application file for complete search history.

(56) References Cited

U.S. PATENT DOCUMENTS

| | | | | |
|---|---|---|---|---|
| 10,224,087 B1* | 3/2019 | Jung | ..................... | G11C 13/004 |
| 2002/0172068 A1* | 11/2002 | Hidaka | ................... | G11C 11/15 |
| | | | | 365/100 |
| 2007/0159870 A1* | 7/2007 | Tanizaki | ............. | G11C 11/5685 |
| | | | | 365/148 |
| 2008/0205146 A1* | 8/2008 | Kajigaya | ................ | G11C 14/00 |
| | | | | 365/185.08 |
| 2011/0007549 A1* | 1/2011 | Wan | .................... | G11C 11/1659 |
| | | | | 365/148 |
| 2011/0267874 A1* | 11/2011 | Ryu | .................... | G11C 11/1659 |
| | | | | 365/158 |
| 2011/0286258 A1* | 11/2011 | Chen | .................... | G11C 13/003 |
| | | | | 365/148 |
| 2012/0020141 A1* | 1/2012 | Kitagawa | ........... | G11C 13/0009 |
| | | | | 365/148 |
| 2013/0322161 A1* | 12/2013 | Noguchi | ............. | G11C 11/1673 |
| | | | | 365/158 |
| 2014/0092665 A1* | 4/2014 | Ueda | ................... | H01L 27/0207 |
| | | | | 365/63 |
| 2014/0233294 A1* | 8/2014 | Ting | .................... | G11C 11/1693 |
| | | | | 365/66 |
| 2014/0293685 A1 | 10/2014 | Noguchi et al. | | |
| 2015/0070982 A1* | 3/2015 | Miyakawa | ............ | H01L 27/228 |
| | | | | 365/158 |
| 2015/0310914 A1* | 10/2015 | Kim | ................... | G11C 13/0069 |
| | | | | 711/125 |
| 2015/0357032 A1* | 12/2015 | Tatsumura | .......... | G11C 11/1673 |
| | | | | 365/72 |
| 2016/0064059 A1* | 3/2016 | Takahashi | ........... | G11C 11/1675 |
| | | | | 365/158 |
| 2017/0263297 A1* | 9/2017 | Matsuoka | .......... | G11C 11/1693 |
| 2018/0075893 A1* | 3/2018 | Matsuoka | .......... | G11C 13/0026 |

FOREIGN PATENT DOCUMENTS

| | | |
|---|---|---|
| KR | 20090119920 A | 11/2009 |
| KR | 20140049108 A | 4/2014 |

* cited by examiner

FIG. 8

|  | WL | SLP | BLP | SLN | BLN |
|---|---|---|---|---|---|
| Idle STATE | L | H | H | H | H |
| DURING Activeate | H | H | H | H | H |
| Active STATE | H | H | H | H | H |
| Write(H) | H | L | H | L | H |
| Write(L) | H | H | L | H | L |
| Read | H | L | H | L | H |

FIG. 9

|  | WL | SLP | BLP | SLN | BLN |
|---|---|---|---|---|---|
| Idle STATE | L | H | H | L | L |
| DURING Activeate | H | H | H | L | L |
| Active STATE | H | H | H | L | L |
| Write(H) | H | L | H | L | H |
| Write(L) | H | H | L | H | L |
| Read | H | L | H | L | H |

FIG. 10

|  | WL | SLP | BLP | SLN | BLN |
|---|---|---|---|---|---|
| Idle STATE | L | H | H | L | L |
| DURING Activeate | H | H | H | H | H |
| Active STATE | H | H | H | L | L |
| Write(H) | H | L | H | L | H |
| Write(L) | H | H | L | H | L |
| Read | H | L | H | L | H |

CONTROL CIRCUIT, SEMICONDUCTOR MEMORY DEVICE, INFORMATION PROCESSING DEVICE, AND CONTROL METHOD

TECHNICAL FIELD

The present disclosure relates to a control circuit, a semiconductor memory device, an information processing device, and a control method.

BACKGROUND ART

As a measure for reducing power consumption in a spin transfer torque magnetoresistive random access memory (STT-MRAM), there is a method of keeping a source line and a bit line in a floating state at the time of standby. Furthermore, there is disclosed a method of preventing destruction of a magnetic tunnel junction (MTJ) element by inserting a transistor between a source line and a bit line to short the source line and the bit line (see, for example, Patent Document 1).

CITATION LIST

Patent Document

Patent Document 1: Japanese Patent Application Laid-Open No. 2014-191835

SUMMARY OF THE INVENTION

Problems to be Solved by the Invention

However, in the method disclosed in Patent Document 1, it is necessary to insert transistors between all the source lines and the bit lines, so that control becomes complicated and wiring resources increase.

Therefore, the present disclosure proposes a novel and improved control circuit, a semiconductor memory device, an information processing device, and a control method that can not only suppress an increase in power consumption with a simple configuration but also prevent erroneous writing and destruction of a memory element.

Solutions to Problems

According to the present disclosure, provided is a control circuit that outputs a signal for discharging charges accumulated in a source line and a bit line according to activation of a word line, and outputs a signal for making the source line and the bit line be in a floating state before a start of writing or reading, with respect to a memory cell including the source line, the bit line, a transistor that is provided between the source line and the bit line, and switches on and off by a potential of the word line, and a memory element connected to the transistor in series.

Furthermore, according to the present disclosure, provided is a semiconductor memory device including: a memory cell including a memory element provided between a source line and a bit line, and a transistor that is provided in series with the memory element and switches on and off by a potential of a word line; and a control circuit that outputs a signal for discharging charges accumulated in the source line and the bit line according to activation of the word line, and outputs a signal for making the source line and the bit line be in a floating state before a start of writing or reading.

Furthermore, according to the present disclosure, there is provided an information processing device including at least the one semiconductor memory device.

Furthermore, according to the present disclosure, provided is a control method, by a processor, including: outputting a signal for discharging charges accumulated in a source line and a bit line according to activation of a word line; and outputting a signal for making the source line and the bit line be in a floating state before a start of writing or reading, with respect to a memory cell including the source line, the bit line, a transistor that is provided between the source line and the bit line, and switches on and off by a potential of the word line, and a memory element connected to the transistor in series.

Effects of the Invention

As described above, according to the present disclosure, a novel and improved control circuit, a semiconductor memory device, an information processing device, and a control method that can not only suppress an increase in power consumption with a simple configuration but also prevent erroneous writing and destruction of a memory element can be provided.

Note that the effect described above is not necessarily limitative, and any of the effects shown in the present specification or other effects that can be understood from the present specification may be exhibited together with the effect described above, or instead of the effect described above.

BRIEF DESCRIPTION OF DRAWINGS

FIG. 8 is an explanatory table showing transition of the state of each line and a transistor of the circuit of the comparative example shown in FIG. 3.

FIG. 9 is an explanatory table showing transition of the state of lines and a transistor of the circuit of the comparative example shown in FIG. 4.

FIG. 10 is an explanatory table showing transition of the state of lines and a transistor of the circuit shown in FIG. 2.

MODE FOR CARRYING OUT THE INVENTION

Figure 1:
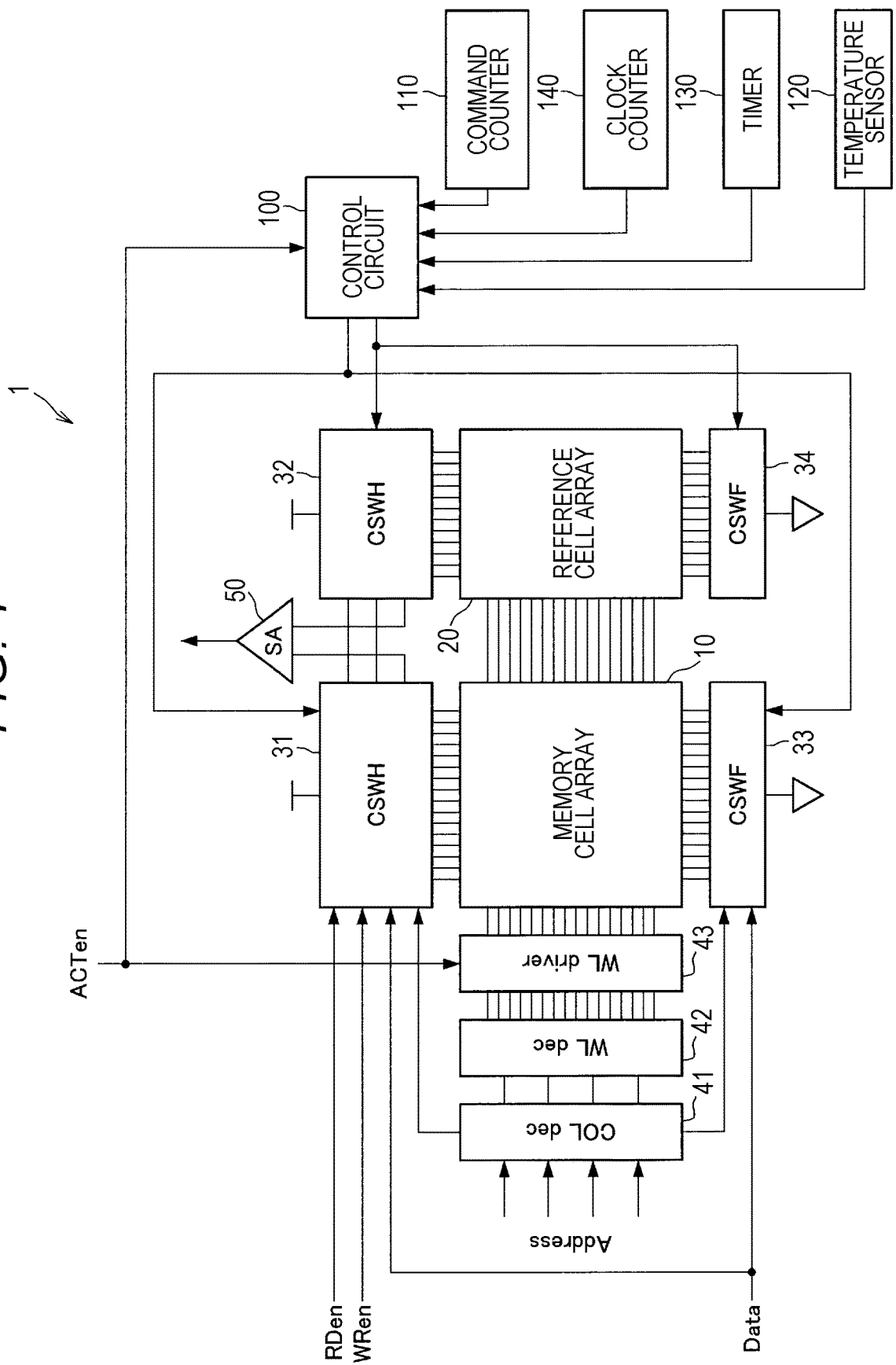
FIG. 1 is an explanatory diagram showing an example of a functional configuration of a semiconductor memory device according to an embodiment of the present disclosure.

Preferred embodiments of the present disclosure will be described in detail below with reference to the accompanying drawings. Note that, in the present specification and the drawings, the same reference numerals are given to the constituent elements having substantially the same functional configuration, and redundant explanations are omitted.

Note that the description will be given in the following order.
1. Embodiment of Present Disclosure
1.1. Overview
1.2. Configuration Example
2. Application Example
3. Conclusion

1. Embodiment of Present Disclosure

1.1. Overview

Before describing the embodiments of the present disclosure in detail, an overview of the embodiments of the present disclosure will be described.

As described above, as a measure for reducing power consumption in a spin transfer torque magnetoresistive random access memory (STT-MRAM), there is a method of keeping a source line and a bit line in a floating state at the time of standby. By keeping the source line and the bit line in a floating state, it is possible to reduce power consumption by transistor leakage flowing through the source line and the bit line from VDD to VSS. When the source line and the bit line are shorted to VSS in the standby state, this through current becomes particularly noticeable at high temperature, and may increase to the same extent as the pulse in the writing although it is a standby current. First, what can be considered in order to reduce the leakage current most simply is to raise the resistance of a leak path by turning off a column switch on the VSS side. However, when a transition is made to the active state in this state, a large potential difference is generated across the magnetic tunnel junction (MTJ) element depending on the timing due to charges accumulated in the source line and the bit line due to the leakage current, and phenomena such as loss of data recorded in the MTJ element and destruction of the MTJ element may occur. These phenomena may occur because the charges accumulated in the source line and the bit line are not necessarily the same amount, and a potential difference naturally occurs between the source line and the bit line.

Therefore, there is disclosed a method of preventing destruction of a magnetic tunnel junction (MTJ) element by inserting a transistor between a source line and a bit line to short the source line and the bit line. Shorting the source line and the bit line eliminates the potential difference between the source line and the bit line as described above. By eliminating the potential difference between the source line and the bit line, phenomena such as loss of data recorded in the MTJ element and destruction of the MTJ element do not occur.

However, if transistors are inserted into all pairs of source lines and bit lines, not only the transistors but also wires for controlling the transistors are required. Since the wiring is crowded around the cell array, it is not desirable to form more wiring than necessary.

Therefore, the present disclosure person diligently studied a technology capable of not only suppressing an increase in power consumption of a semiconductor memory device with a simple configuration but also preventing erroneous writing and destruction of a memory element. As a result, as described below, the present disclosure person devises a technology capable of not only suppressing an increase in power consumption of a semiconductor memory device with a simple configuration but also preventing erroneous writing and destruction of a memory element.

1.2. Configuration Example

Subsequently, an embodiment of the present disclosure will be described in detail. FIG. 1 is an explanatory diagram showing an example of a functional configuration of a semiconductor memory device according to an embodiment of the present disclosure. An example of a functional configuration of the semiconductor memory device according to the embodiment of the present disclosure will be described below with reference to FIG. 1.

As shown in FIG. 1, a semiconductor memory device 1 according to the embodiment of the present disclosure includes a memory cell array 10, a reference cell array 20, column control switches 31 and 32 on a VDD side, column control switches 33 and 34 on a VSS side, a column decoder 41, a word line decoder 42, a word line driver 43, a sense amplifier 50, a control circuit 100, a command counter 110, a temperature sensor 120, a timer 130, and a clock counter 140.

The memory cell array 10 includes memory cells having memory elements arranged in a matrix. In the present embodiment, as the memory element, an element is used which utilizes the fact that the resistance state changes reversibly in accordance with the polarity of the potential difference applied across both ends to store information. As such an element, an MTJ element can be used as described above. The memory element has two distinguishable resistance states (a low resistance state and a high resistance state). Furthermore, the memory cell array 10 also has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 31 on the VDD side and the column control switch 33 on the VSS side.

The reference cell array 20 has a plurality of reference cells arranged in a matrix. Furthermore, as similar to the memory cell array 10, the reference cell array 20 has a plurality of word lines extending in a row direction (horizontal direction), and a plurality of bit lines and a plurality of source lines extending in a column direction (vertical direction). One end of each word line is connected to the word line driver 43, and each bit line is connected to the column control switch 32 on the VDD side and the column control switch 34 on the VSS side.

In the present embodiment, the reference cells provided in the reference cell array 20 have a high resistance reference cell and a low resistance reference cell. With the high resistance reference cell and the low resistance reference cell, the combined resistance value of the reference cells is made to be a desired value between high resistance and low resistance.

The column control switches 31 to 34 connect a bit line and a source line related to a memory cell to be driven among a plurality of bit lines and source lines of the memory cell array 10 to a bit line drive unit and a source line drive unit (not shown) on the basis of control signals. The control signals supplied to the column control switches 31 to 34 include a read enable signal RDen and a write enable signal WRen. Furthermore, a data signal Data and a signal from the column decoder (a decoded column address signal) are sent to the column control switches 31 to 34.

The column decoder 41 decodes the address signal and sends the decoded signal to the column control switches 31 to 34. The word line decoder 42 decodes the address signal and sends the decoded signal to the word line driver 43. The word line driver 43 selects a memory cell to be driven in the memory cell array 10 on the basis of a control signal. Specifically, the word line driver 43 applies a signal to the word line of the memory cell array 10 to select the row to which the memory cell to be subjected to the data write or read operation belongs. In addition to the signal from the word line decoder 42, a signal ACTen for activating the word line is sent to the word line driver 43.

When reading data from the memory cell of the memory cell array 10, the sense amplifier 50 compares the potential output through the bit line with the reference potential generated by the reference cell of the reference cell array 20, and outputs data indicating whether the potential is higher (H) or lower (L) than the reference potential.

As described later, the control circuit 100 is a circuit that outputs a signal for releasing charges accumulated in the source line and the bit line before a high level potential is applied to (before activation of) a word line WL.

Figure 2:
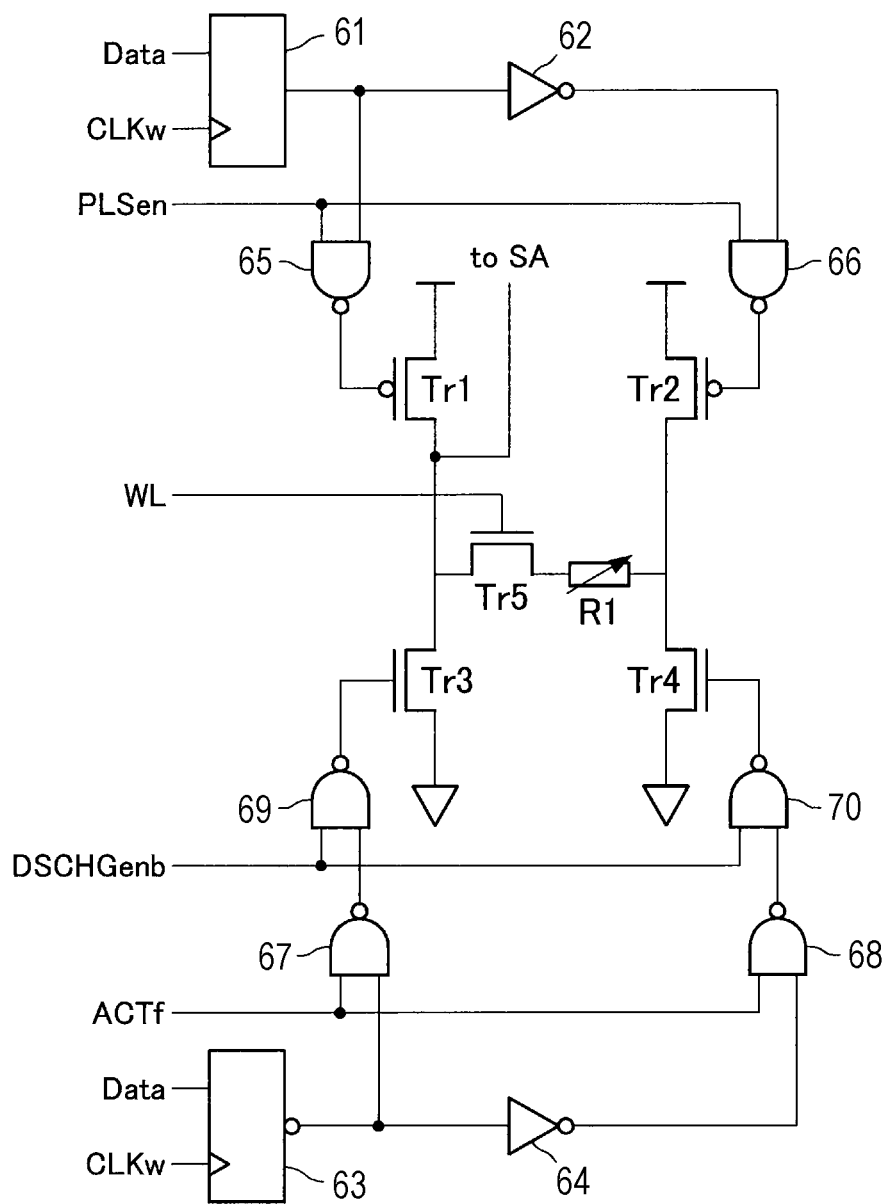
FIG. 2 is an explanatory diagram showing an example of a circuit configuration of the memory cell array 10 and a periphery of the memory cell array 10.

FIG. 2 is an explanatory diagram showing an example of a circuit configuration of the memory cell array 10 and a periphery of the memory cell array 10. The peripheral circuits of the memory cell array 10 shown in FIG. 2 are circuits for performing write operation on a memory cell. FIG. 2 shows registers 61 and 63, NOT gates 62 and 64, NAND gates 65 to 70, and the transistors Tr1 to Tr5. In the memory cell array 10, when one of the transistors Tr1 and Tr2 is turned on and one of the transistors Tr3 and Tr4 is turned on by the NOT gates 62 and 64, writing of data to the memory element R1 can be performed, in other words, the resistance state of the memory element R1 can be changed.

Here, the output of the NAND gate 67 and a signal DSCHGenb are input to the NAND gate 69. Similarly, the output of the NAND gate 68 and the signal DSCHGenb are input to the NAND gate 70. The signal DSCHGenb is output from control circuit 100. By setting the signal DSCHGenb to the low level before a high level potential is applied to (before activation of) the word line WL, the transistors Tr3 and Tr4 are turned on, and the source line SL and the bit line BL are shorted to VSS. When the source line SL and the bit line BL are shorted to VSS, the charges accumulated in the source line SL and the bit line BL are discharged.

Figure 3:
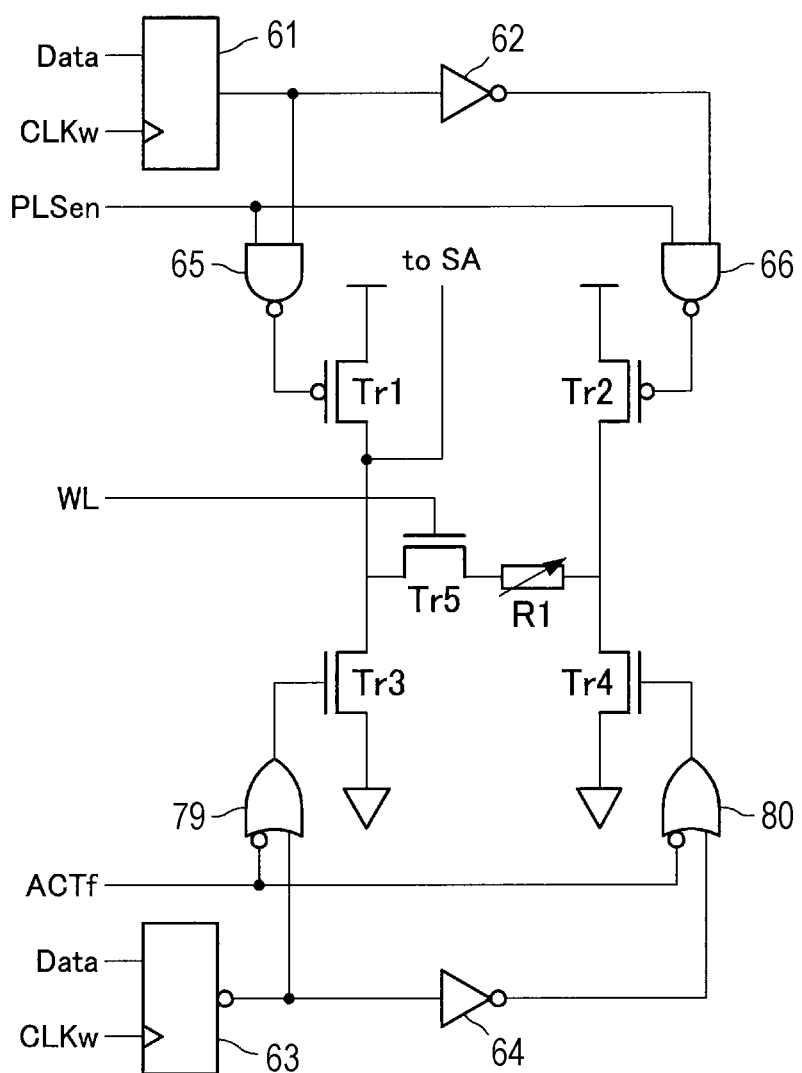
FIG. 3 is an explanatory diagram showing a circuit which is a comparative example of the circuit shown in FIG. 2.
Figure 4:
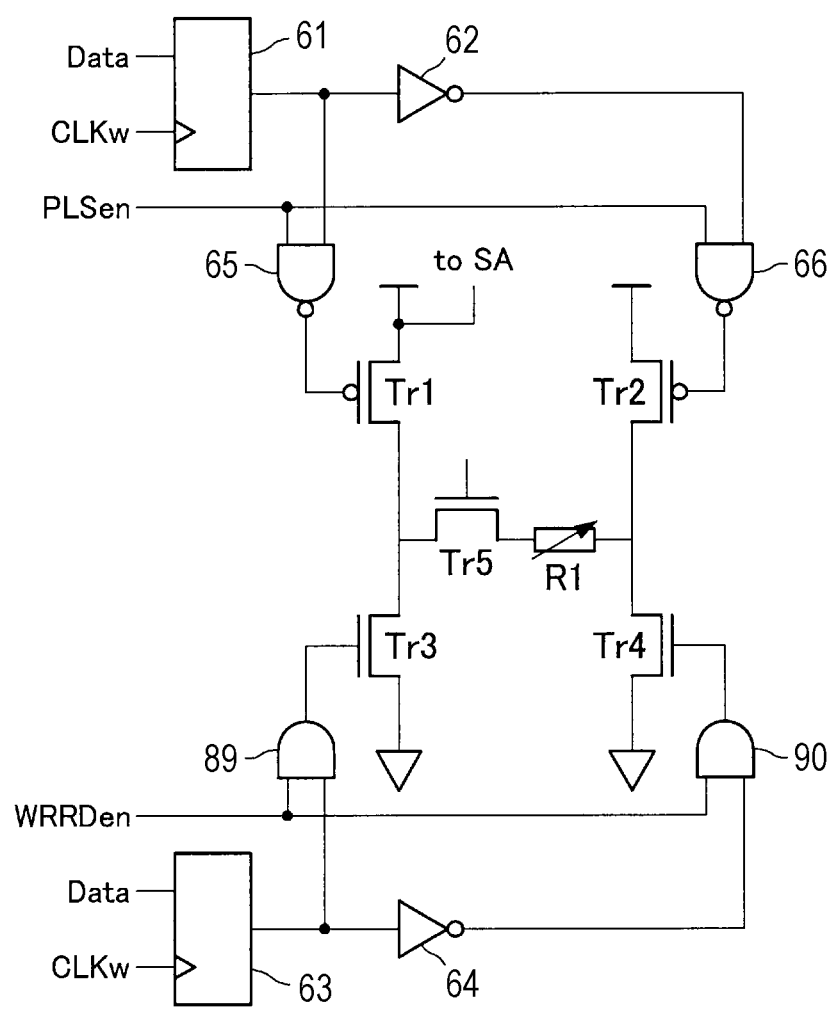
FIG. 4 is an explanatory diagram showing a circuit which is a comparative example of the circuit shown in FIG. 2.

Here, two circuits of the comparative example are shown to explain the operation of the circuit shown in FIG. 2. FIGS. 3 and 4 are explanatory diagrams showing the circuit which is the comparative example of the circuit shown in FIG. 2. FIG. 3 shows a circuit example in which the potentials of the source line and the bit line are fixed at VSS during standby, and OR gates 79 and 80 to which ACTf is inverted and input are provided instead of the NAND gates 67 to 70. FIG. 4 shows a circuit example of a case of making the source line and the bit line be in a floating state during standby, and AND gates 89 and 90 are provided instead of the NAND gates 67 to 70.

First, consider the circuit shown in FIG. 3. This circuit is intended to keep the potential across both ends of the memory element, in other words, the potentials of the source line and the bit line at VSS during standby with no access to the memory, thereby preventing an excess potential difference across both ends of the memory element, and reliably keeping a value to the memory element.

Figure 5:
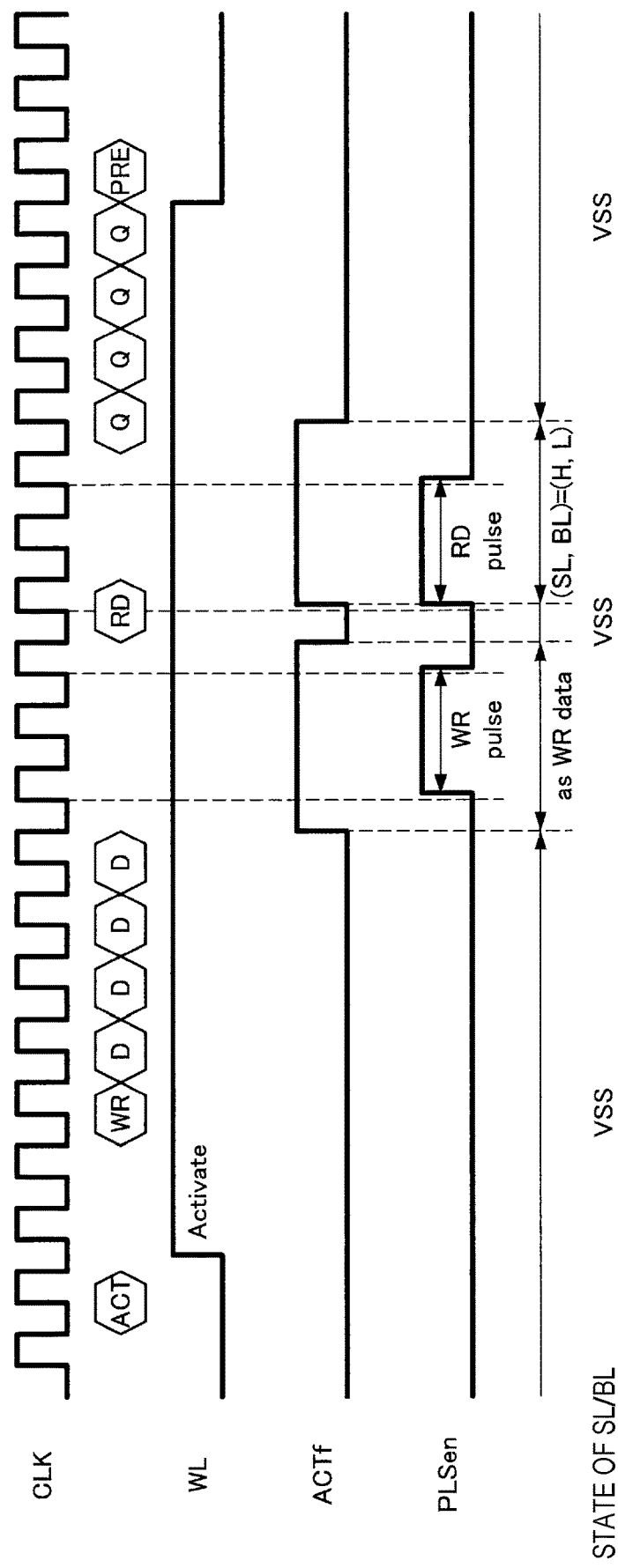
FIG. 5 is an explanatory diagram showing operation of the circuit shown in FIG. 3 by a timing chart.

FIG. 5 is an explanatory diagram showing operation of the circuit shown in FIG. 3 by a timing chart. As shown in FIG. 5, the circuit shown in FIG. 3 keeps the potentials of the source line and the bit line at VSS during standby other than the read operation and the write operation.

However, if the potentials of the source line and the bit line are fixed to VSS during standby, a leakage current (through current) may occur from VDD to VSS. As described above, when the source line and the bit line are shorted to VSS in the standby state, this through current becomes particularly noticeable at high temperature, and may increase to the same extent as the pulse in the writing although it is a standby current. One of the causes is that, in order to increase the margin at the time of reading, the resistance of the transistor of the column control switch is reduced by increasing the size of the column control switch. In other words, the relatively low resistance even when the transistor of the column control switch is off contributes to the increase in power during standby.

Figure 6:
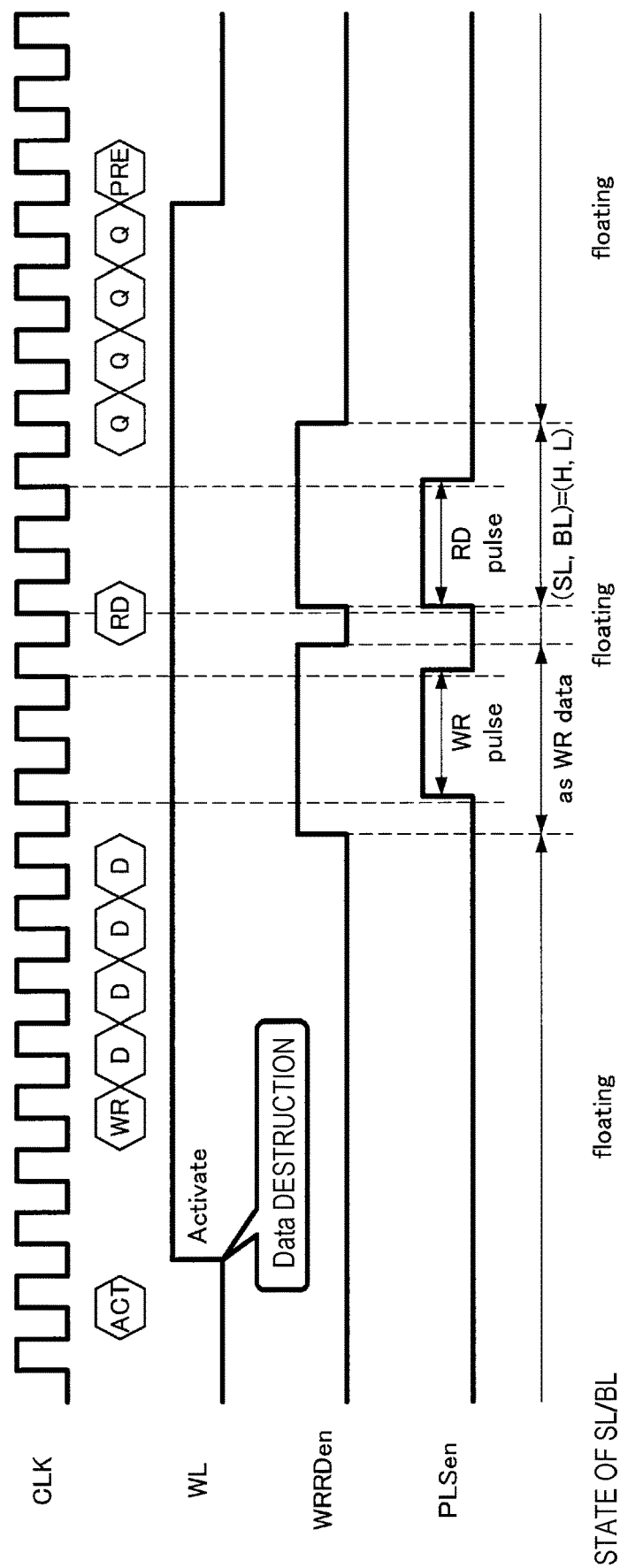
FIG. 6 is an explanatory diagram showing operation of the circuit shown in FIG. 4 by a timing chart.

Therefore, the circuit shown in FIG. 4 is intended to suppress the leakage current by also turning off the transistor on the VSS side and setting it to a floating state during standby. FIG. 6 is an explanatory diagram showing operation of the circuit shown in FIG. 4 by a timing chart. As shown in FIG. 5, in the circuit shown in FIG. 4, the source line and the bit line are in a floating state during standby other than the read operation and the write operation.

The leakage current can be suppressed by also turning off the transistor on the VSS side during standby, but on the other hand, charges are accumulated in the source line and the bit line during standby, and these charges may destroy data accumulated in the memory element (in other words, erroneously write) in a process of transition to the active state, or destroy the memory element itself.

Also in a steady state, there is a difference in resistance division value between VDD and VSS at the node to which the memory element is connected, and a potential difference may occur between the source line and the bit line. When the word line is activated in this state, the potential difference between the source line and the bit line may cause electrostatic destruction of the memory element. Therefore, the generation of the potential difference across both ends of the memory element cannot be suppressed only by turning off the transistor on the VSS side.

As described above, by inserting a transistor between the source line and the bit line to short the source line and the bit line, the potential difference between the source line and the bit line can be eliminated. However, if transistors are inserted into all pairs of source lines and bit lines, not only the transistors but also wires for controlling the transistors are required. Since the wiring is crowded around the cell array, it is not desirable to form more wiring than necessary.

Therefore, in the present embodiment, as shown in FIG. 2, the control circuit 100 sets the signal DSCHGenb to the low level before the high level potential is applied to the word line WL. The semiconductor memory device 1 according to the embodiment of the present disclosure has a configuration in which by setting the signal DSCHGenb to the low level before the high level potential is applied to the word line WL, the source line and the bit line are shorted to the VSS, and the charges accumulated in the source line and the bit line are discharged.

Figure 7:
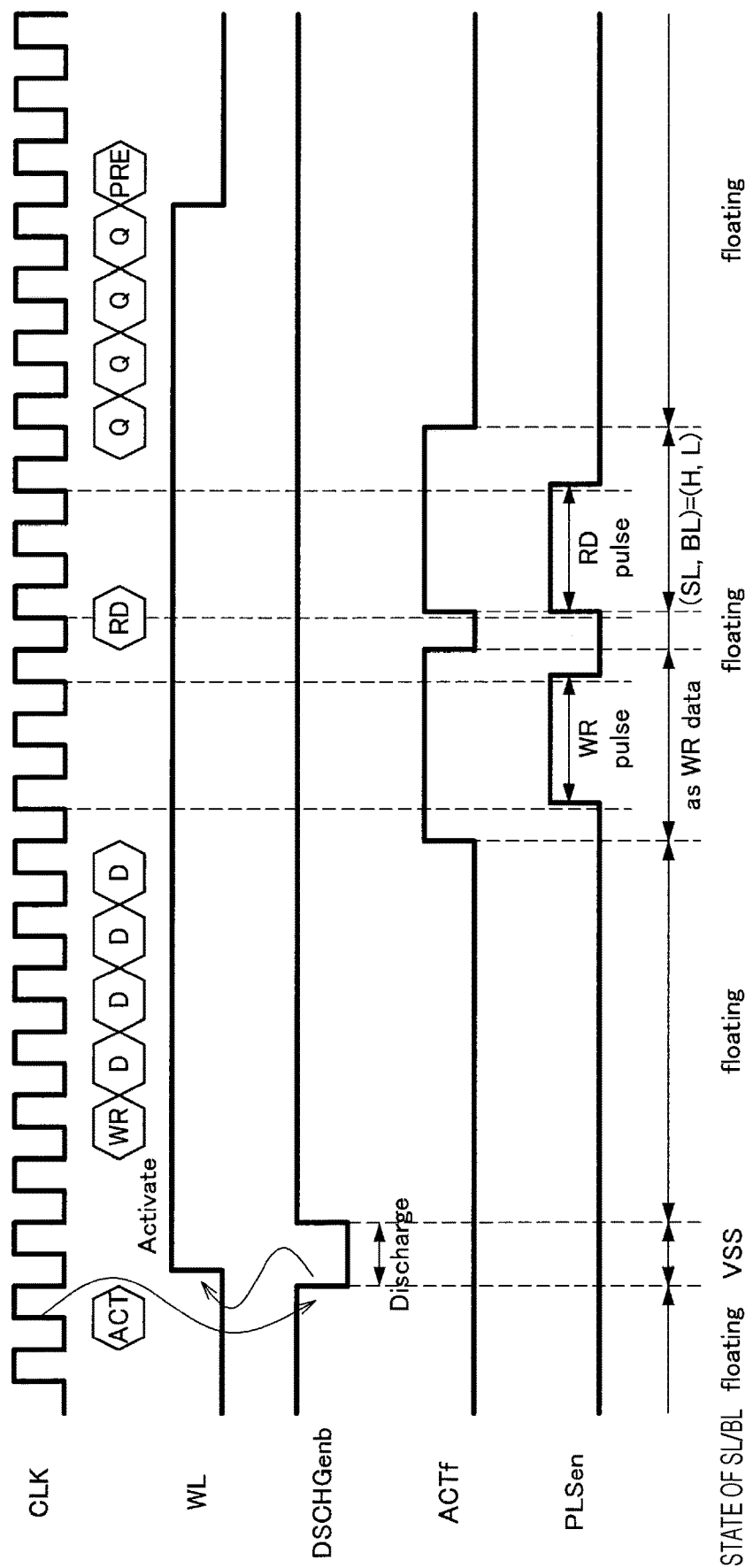
FIG. 7 is an explanatory diagram showing operation of the circuit shown in FIG. 2 by a timing chart.

FIG. 7 is an explanatory diagram showing operation of the circuit shown in FIG. 2 by a timing chart. In the circuit shown in FIG. 2, the source line SL and the bit line BL are in a floating state until the DSCHGenb becomes the low level. The floating state of the source line SL and the bit line BL makes it possible to reduce the leakage current. Furthermore, since the source line SL and the bit line BL are in a floating state, erroneous writing to data stored in the memory element is not performed. Then, when activation of the word line WL is given in instruction, the control circuit 100 changes the signal DSCHGenb to the low level before the potential of the word line WL becomes the high level. When the signal DSCHGenb becomes the low level, the transistors Tr3, Tr4 are turned on, and the source line SL and the bit line BL are shorted to the VSS. When the source line SL and the bit line BL are shorted to VSS, the charges accumulated in the source line SL and the bit line BL are discharged. By discharging the charges accumulated in the source line SL and the bit line BL, the potential of the source line SL and the potential of the bit line BL are equalized, and therefore, a large potential difference does not occur in between the source line SL and the bit line BL.

After the signal DSCHGenb becomes the low level, the potential of the word line WL becomes the high level, and after the potential of the word line WL becomes the high level, the control circuit 100 changes the signal DSCHGenb to the high level. When the signal DSCHGenb becomes the high level, the source line SL and the bit line BL are in a floating state until the signal ACTf becomes the high level. Here, when the source line SL and the bit line BL are in the floating state, it is also possible to suppress the leakage current in the active standby state in which the write or read pulse does not rise. In particular, in a case of a memory in which input and output by burst transfer is performed, since the period of the active standby state also becomes long, suppression of the leakage current in the active standby state is highly important and effective also from the viewpoint of memory power consumption suppression.

In a case of the write operation to the memory element, first, the write command is received and the data is received, and the data is once stored in a register. The stored data controls the transistor of the column control switch to a desired direction by the signal ACTf becoming the high level before the write pulse rises. Thereafter, a write pulse is issued by the signal PLSen. After the write pulse is broken (the signal PLSen becomes the low level), the signal ACTf becomes the low level, and the source line SL and the bit line BL are in a floating state.

In a case where data is read out from the memory element, data (the high level data in the example of FIG. 7) causing a potential to be generated in one of the source line SL and the bit line BL that is connected to the sense amplifier 50 (the source line SL in the circuit of FIG. 2) is transferred to the register. Thereafter, a write pulse is issued by the signal PLSen. After the read pulse is broken (the signal PLSen becomes the low level), the signal ACTf becomes the low level, and the source line SL and the bit line BL are in a floating state.

The control circuit 100 outputs, to the circuit shown in FIG. 2, a signal for discharging the charges accumulated in the source line SL and the bit line BL before the potential of the word line WL becomes the high level. By such operation, the control circuit 100 can not only suppress an increase in power consumption of the semiconductor memory device 1 with a simple configuration but also prevent erroneous writing and destruction of a memory element.

FIG. 8 is an explanatory table showing transition of the state of each line and a transistor of the circuit of the comparative example shown in FIG. 3. FIG. 9 is an explanatory table showing transition of the state of lines and a transistor of the circuit of the comparative example shown in FIG. 4. Then, FIG. 10 is an explanatory table showing the transition of the state of lines and a transistor of the circuit shown in FIG. 2. In FIGS. 8 to 10, H means high level and L means low level.

As shown in FIG. 8, in a case where the potentials of the source line and the bit line are fixed to the VSS during standby, SLN and BLN are both high (H) in the idle state, during activation, and in the active state. Furthermore, as shown in FIG. 9, in a case where the potentials of the source line and the bit line are in a floating state during standby, SLN and BLN are both low (L) in the idle state, during activation, and in the active state.

On the other hand, in the circuit shown in FIG. 10, SLN and BLN are both low in the idle state. Then, during activation, SLN and BLN both become high, and in this state, the charges accumulated in the source line SL and the bit line BL are discharged. Then, in the active state, SLN and BLN are both low again. By such transition, the semiconductor memory device 1 according to the present embodiment can not only suppress an increase in power consumption but also prevent erroneous writing and destruction of a memory element.

Figure 11:
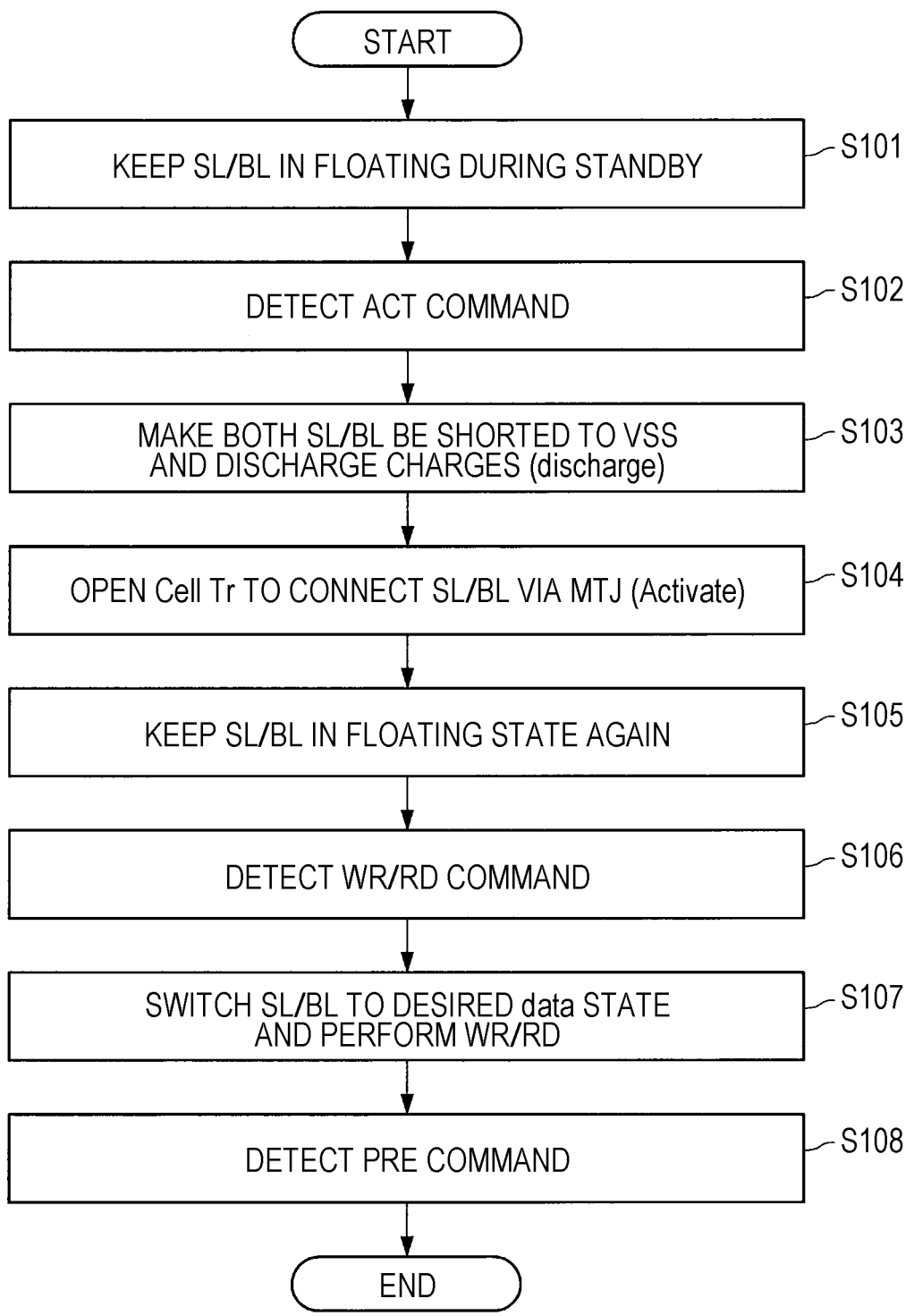
FIG. 11 is a flow chart showing an operation example of the semiconductor memory device 1 according to the same embodiment.

FIG. 11 is a flow chart showing an operation example of the semiconductor memory device 1 according to the embodiment of the present disclosure. Hereinafter, an example of operation of the semiconductor memory device 1 according to the embodiment of the present disclosure will be described with reference to FIG. 11.

During standby, the semiconductor memory device 1 keeps the source line SL and the bit line BL in the floating state by the signal from the control circuit 100 (step S101). When the control circuit 100 detects an activate command during standby (step S102), the control circuit 100 outputs a signal to short the source line SL and the bit line BL to VSS (step S103). By shorting the source line SL and the bit line BL to VSS, the charges accumulated in the source line SL and the bit line BL are discharged as described above, and the potential difference between the source line SL and the bit line BL is eliminated.

When the source line SL and the bit line BL are shorted to the VSS, the semiconductor memory device 1 subsequently supplies a predetermined potential (for example, a high level potential) to the bit line BL, and turns on the transistor connected in series to the memory element to connect the source line SL and the bit line BL via the memory element (step S104).

When the source line SL and the bit line BL are connected via the memory element and the active standby state is established, subsequently, the semiconductor memory device 1 keeps the source line SL and the bit line BL in a floating state by a signal from the control circuit 100 (step S105).

Thereafter, when a write command or a read command is generated (step S106), the semiconductor memory device 1 switches the source line SL and the bit line BL to a desired data state, and performs write processing or read processing (step S107). Thereafter, when a precharge (PRE) command is generated (step S108), the semiconductor memory device 1 is again in the standby state, and keeps the source line SL and the bit line BL in the floating state by the signal from the control circuit 100.

By such operation, the semiconductor memory device 1 according to the present embodiment can not only suppress an increase in power consumption but also prevent erroneous writing and destruction of a memory element.

2. Application Example

Figure 12:
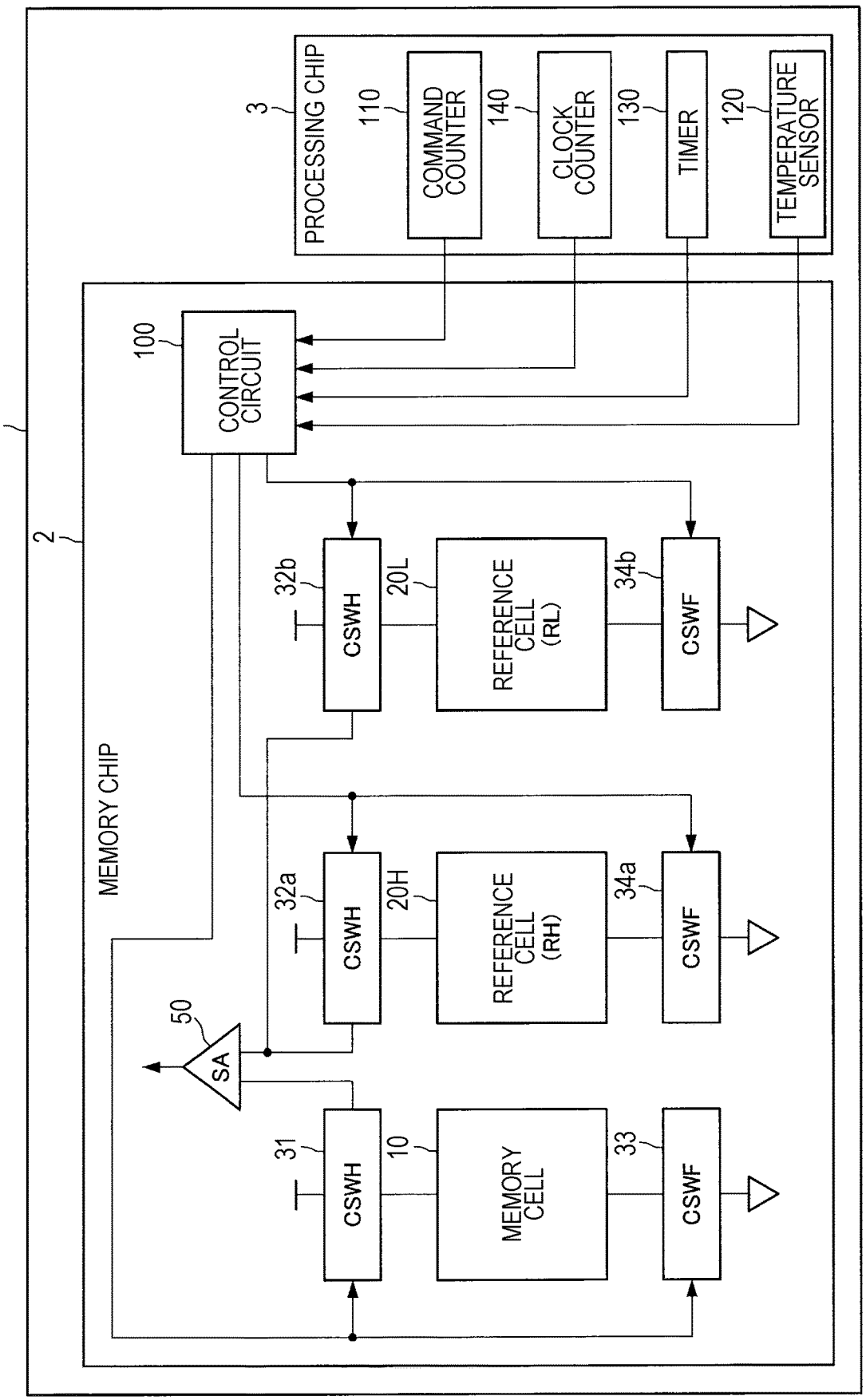
FIG. 12 is an explanatory diagram showing an example of a configuration of the semiconductor memory device 1 according to the same embodiment.

In the semiconductor memory device 1 according to the embodiment of the present disclosure, all configurations may be formed on one chip, and some configurations may be formed on another chip. FIG. 12 is an explanatory diagram showing a configuration example of the semiconductor memory device 1 according to the embodiment of the present disclosure. For example, the semiconductor memory device 1 may include a memory chip 2 and a processing chip 3. As shown in FIG. 12, the command counter 110, the temperature sensor 120, the timer 130, and the clock counter 140 may be formed in the processing chip 3, and other configurations may be formed in the memory chip 2. The memory chip 2 and the processing chip 3 may be then mounted on a system in package or a system on chip. Note that, in FIG. 12, as the reference cells provided in the reference cell array 20, a high resistance reference cell 20*a* and a low resistance reference cell 20*b* are provided. Furthermore, FIG. 12 shows column control switches 32*a* and 34*a* for the high resistance reference cell 20*a* and column control switches 32*b* and 34*b* for the low resistance reference cell 20*b*.

Then, the semiconductor memory device 1 according to the embodiment of the present disclosure can be mounted on various electronic devices. Examples of an electronic device on which the semiconductor memory device 1 according to the embodiment of the present disclosure can be mounted include a smartphone, a tablet terminal, a digital still camera, a digital video camera, a music player, a set top box, a computer, a television, a watch, an active speaker, headsets, a game console, a radio, a measuring instrument, an electronic tag, and a beacon.

Figure 13:
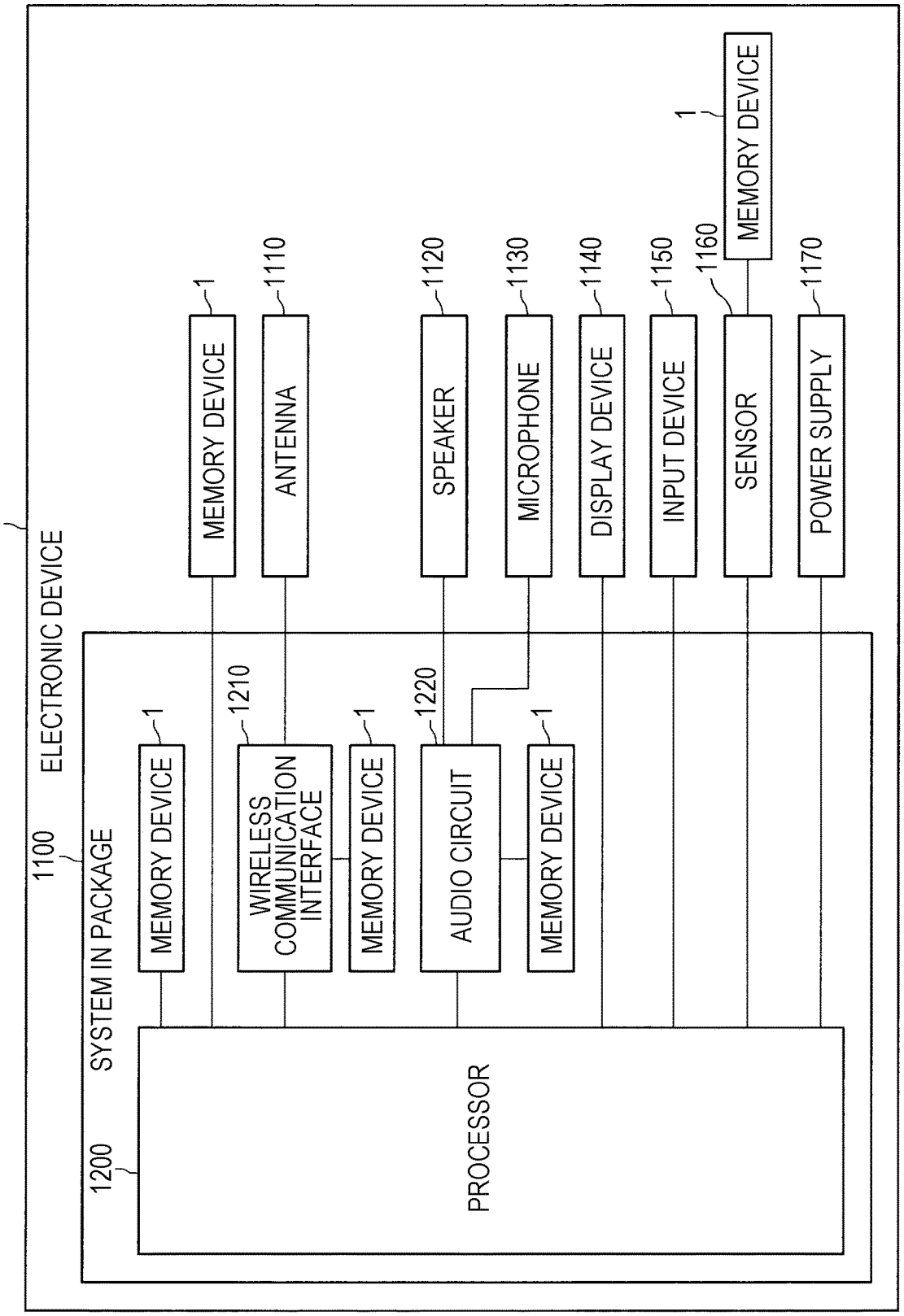
FIG. 13 is an explanatory diagram showing an example of a functional configuration of an electronic device 1000 on which the semiconductor memory device 1 according to the same embodiment can be mounted.

FIG. 13 is an explanatory diagram showing an example of a functional configuration of an electronic device 1000 on which the semiconductor memory device 1 according to the embodiment of the present disclosure can be mounted. The electronic device 1000 shown in FIG. 13 includes a system in package 1100, an antenna 1110, a speaker 1120, a microphone 1130, a display device 1140, an input device 1150, a sensor 1160, and a power supply 1170. Furthermore, the system in package 1100 includes a processor 1200, a wireless communication interface 1210, and an audio circuit 1220.

The antenna 1110 is an antenna for performing mobile communication, wireless LAN, or near field communication, and is connected to the wireless communication interface 1210. The speaker 1120 outputs sound and is connected to the audio circuit 1220. The microphone 1130 is for collecting sound around the electronic device 1000, and is connected to the audio circuit 1220.

The display device 1140 includes, for example, a liquid crystal display, an organic EL display, a light emitting diode (LED) indicator, and the like, and is connected to the processor 1200. The input device 1150 includes, for example, a keyboard, a button, a touch panel, and the like, and is connected to the processor 1200.

The sensor 1160 has functions such as an optical sensor, a position sensor, an acceleration sensor, a living body sensor, a magnetic sensor, a mechanical quantity sensor, a heat sensor, an electric sensor or a chemical sensor. The variable resistance semiconductor memory device 1 according to the embodiment of the present disclosure may be connected to the sensor 1160. The power supply 1170 supplies power to the electronic device 1000, and is a power supply supplied from, for example, a battery or an AC adapter.

The processor 1200 is an electronic circuit for controlling the operation of the electronic device 1000, and the variable resistance semiconductor memory device 1 according to the embodiment of the present disclosure may be connected to inside or outside the system in package 1100.

The wireless communication interface 1210 has a function of mobile communication, wireless LAN or near field communication. The variable resistance semiconductor memory device 1 according to the embodiment of the present disclosure may be connected to the wireless communication interface 1210. The audio circuit 1220 has a function of controlling the speaker 1120 and the microphone 1130, and the variable resistance semiconductor memory device 1 according to the embodiment of the present disclosure may be connected to the audio circuit 1220.

By mounting the variable resistance semiconductor memory device 1 according to the embodiment of the present disclosure, such an electronic device 1000 can improve the reliability of writing at the time of data write while suppressing the power consumption.

3. Conclusion

As described above, according to the embodiment of the present disclosure, provided is the semiconductor memory device 1 capable of reducing the standby current without adding the transistor and the wiring to the memory cell array, and preventing erroneous writing to the memory element and destruction of the memory element due to the charges accumulated in the source line and the bit line. The semiconductor memory device 1 according to the embodiment of the present disclosure can suppress standby leakage not only during the standby state but also during the active standby state.

Furthermore, the semiconductor memory device 1 according to the embodiment of the present disclosure can suppress power consumption, which leads to improvement in the product value of the final product or chip on which the semiconductor memory device 1 is mounted, and contributes to cost reduction. Moreover, the final product on which the semiconductor memory device 1 according to the embodiment of the present disclosure is mounted can improve the operation time and can suppress heat generation during operation, thereby reducing the cost due to the reduction of members for heat generation prevention, and prolonging the product life.

While preferred embodiments of the present disclosure have been described above in detail with reference to the accompanying drawings, the technical scope of the present disclosure is not limited to such examples. It is obvious that various variations and modifications can be conceived within the scope of the technical idea described in the claims by a person having ordinary knowledge in the field of technology to which the present disclosure belongs, and, of course, it is understood that these variations and modifications belong to the technical scope of present disclosure.

Furthermore, the effects described in the present specification are merely illustrative or exemplary, and are not limitative. That is, the technique according to the present disclosure can exhibit other effects obvious to those skilled in the art from the description of the present specification together with the effects described above or instead of the effects described above.

Note that the following configuration is also within the technical scope of the present disclosure.

(1)

A control circuit that outputs a signal for discharging charges accumulated in a source line and a bit line according to activation of a word line, and outputs a signal for making the source line and the bit line be in a floating state before a start of writing or reading, with respect to a memory element including the source line, the bit line, a transistor that is provided between the source line and the bit line, and switches on and off by a potential of the word line, and a memory element connected to the transistor in series.

(2)

The control circuit according to (1) described above, in which both the source line and the bit line are shorted to a ground potential in response to the activation of the word line.

(3)

The control circuit according to (2) described above, in which the transistor is turned on after both the source line and the bit line are shorted to the ground potential.

(4)

The control circuit according to (3) described above, in which a signal for making the source line and the bit line be in a floating state is output after the transistor is turned on.

(5)

A semiconductor memory device including:
a memory cell including a memory element provided between a source line and a bit line, and a transistor that is provided in series with the memory element and switches on and off by a potential of a word line; and
a control circuit that outputs a signal for discharging charges accumulated in the source line and the bit line according to activation of the word line, and outputs a signal for making the source line and the bit line be in a floating state by a start of writing or reading.

(6)

The semiconductor memory device according to (5) described above, in which both the source line and the bit line are shorted to a ground potential in response to the activation of the word line.

(7)

The semiconductor memory device according to (6) described above, in which the transistor is turned on after both the source line and the bit line are shorted to the ground potential.

(8)

The semiconductor memory device according to (7) described above, in which a signal for making the source line and the bit line be in a floating state is output after the transistor is turned on.

(9)

The semiconductor memory device according to any one of (5) to (8) described above, in which the memory element is a variable resistance memory element.

(10)

The semiconductor memory device according to (9) described above, in which the memory element is a variable magnetoresistance memory element.

(11)

An information processing device including at least the one semiconductor memory device according to any one of (5) to (10) described above.

(12)

A control method, by a processor, including:
outputting a signal for discharging charges accumulated in a source line and a bit line according to activation of a word line; and
outputting a signal for making the source line and the bit line be in a floating state by a start of writing or reading, with respect to a memory element including the source line, the bit line, a transistor that is provided between the source line and the bit line, and switches on and off by a potential of the word line, and a memory element connected to the transistor in series.

REFERENCE SIGNS LIST

1 Semiconductor memory device
100 Control circuit

The invention claimed is:
1. A control circuit that outputs a signal for discharging charges accumulated in a source line and a bit line according to activation of a word line, and outputs a signal for making the source line and the bit line be in a floating state by a start of writing or reading, with respect to a memory cell including the source line, the bit line, a transistor that is provided between the source line and the bit line, and switches on and off by a potential of the word line, and a memory element connected to the transistor in series,
wherein the control circuit includes a first transistor connected to the source line and a second transistor connected to the bit line, and the first transistor includes a first gate terminal and the second transistor includes a second gate terminal,
wherein the first gate terminal is connected with a first NAND gate and the second terminal is connected with a second NAND gate, and
wherein each of the source line and the bit line transition from respective first floating states, (i) at a first time, to respective non-floating states shorted to a ground potential responsive to the signal for discharging charges, and (ii) at a second time, to respective second floating states.

2. The control circuit according to claim 1, wherein the transistor is turned on after both the source line and the bit line are shorted to the ground potential.

3. The control circuit according to claim 2, wherein the signal for making the source line and the bit line be in a floating state is output after the transistor is turned on.

4. A semiconductor memory device comprising:
a memory cell including a memory element provided between a source line and a bit line, and a transistor that is provided in series with the memory element and switches on and off by a potential of a word line; and
a control circuit that outputs a signal for discharging charges accumulated in the source line and the bit line according to activation of the word line, and outputs a signal for making the source line and the bit line be in a floating state by a start of writing or reading,
wherein the control circuit includes a first transistor connected to the source line and a second transistor connected to the bit line, and the first transistor includes a first gate terminal and the second transistor includes a second gate terminal,
wherein the first gate terminal is connected with a first NAND gate and the second terminal is connected with a second NAND gate, and
wherein each of the source line and the bit line transition from respective first floating states, (i) at a first time, to respective non-floating states shorted to a ground potential responsive to the signal for discharging charges, and (ii) at a second time, to respective second floating states.

5. The semiconductor memory device according to claim 4, wherein the control circuit turns on the transistor after making both the source line and the bit line be shorted to the ground potential.

6. The semiconductor memory device according to claim 5, wherein the control circuit outputs the signal for making the source line and the bit line be in a floating state after turning on the transistor.

7. The semiconductor memory device according to claim 4, wherein the memory element is a variable resistance memory element.

8. The semiconductor memory device according to claim 4, wherein the memory element is a variable magnetoresistance memory element.

9. An information processing device comprising at least the one semiconductor memory device according to claim 4.

10. A control method, by a processor, comprising:
outputting, by a control circuit, a signal for discharging charges accumulated in a source line and a bit line according to activation of a word line; and
outputting a signal for making the source line and the bit line be in a floating state by a start of writing or reading, with respect to a memory cell including the source line, the bit line, a transistor that is provided between the source line and the bit line, and switches on and off by a potential of the word line, and a memory element connected to the transistor in series,
wherein the control circuit includes a first transistor connected to the source line and a second transistor connected to the bit line, and the first transistor includes a first gate terminal and the second transistor includes a second gate terminal,
wherein the first gate terminal is connected with a first NAND gate and the second terminal is connected with a second NAND gate, and
wherein each of the source line and the bit line transition from respective first floating states, (i) at a first time, to respective non-floating states shorted to a ground potential responsive to the signal for discharging charges, and (ii) at a second time, to respective second floating states.

* * * * *